United States Patent [19]

Goodrich

[11] 4,222,087
[45] Sep. 9, 1980

[54] PASSIVE TRIAC OUTPUT ASYMMETRY DETECTOR

[75] Inventor: Edward W. Goodrich, Palm Beach, Fla.

[73] Assignee: Hawthorne Industries, Inc., West Palm Beach, Fla.

[21] Appl. No.: 935,473

[22] Filed: Aug. 21, 1978

[51] Int. Cl.² ............................................. H02H 3/00
[52] U.S. Cl. ................................... 361/104; 307/310; 361/31
[58] Field of Search ................. 361/103, 104, 106, 31, 361/24, 23; 219/501, 469–471; 307/310; 337/102, 103, 153, 182

[56] References Cited

U.S. PATENT DOCUMENTS

| | | | |
|---|---|---|---|
| 3,693,047 | 9/1972 | Hamstra | 361/24 |
| 3,717,793 | 2/1973 | Peterson | 361/104 |
| 3,794,811 | 2/1974 | Hehl | 361/104 X |
| 3,857,083 | 12/1974 | Lundstrom | 361/104 X |
| 4,038,584 | 7/1977 | Tarchalski et al. | 361/104 |

*Primary Examiner*—Patrick R. Salce
*Attorney, Agent, or Firm*—Barry L. Haley; Eugene F. Malin

[57] ABSTRACT

A passive circuit for protecting an AC driven load controlled by a solid state device such as a triac or the like. The circuit is coupled to the load and the solid state controller element and effects shutdown of the AC power to the load and the load control element whenever an asymmetrical AC power input measured over a predetermined number of cycles is received by the load from the controller element. The device includes an inductor having a thermal link coupled thereto, the inductor being connected in parallel to the AC load which is being controlled by a triac or other similar device. Should asymmetrical input power be received from the controller, which could be occasioned by failure of the controller element itself, the inductor across the load will become heated by asymmetrical input power, causing heating of the thermal link. At a predetermined temperature, the thermal link will open, which removes AC input power to both the load and the controller element.

2 Claims, 1 Drawing Figure

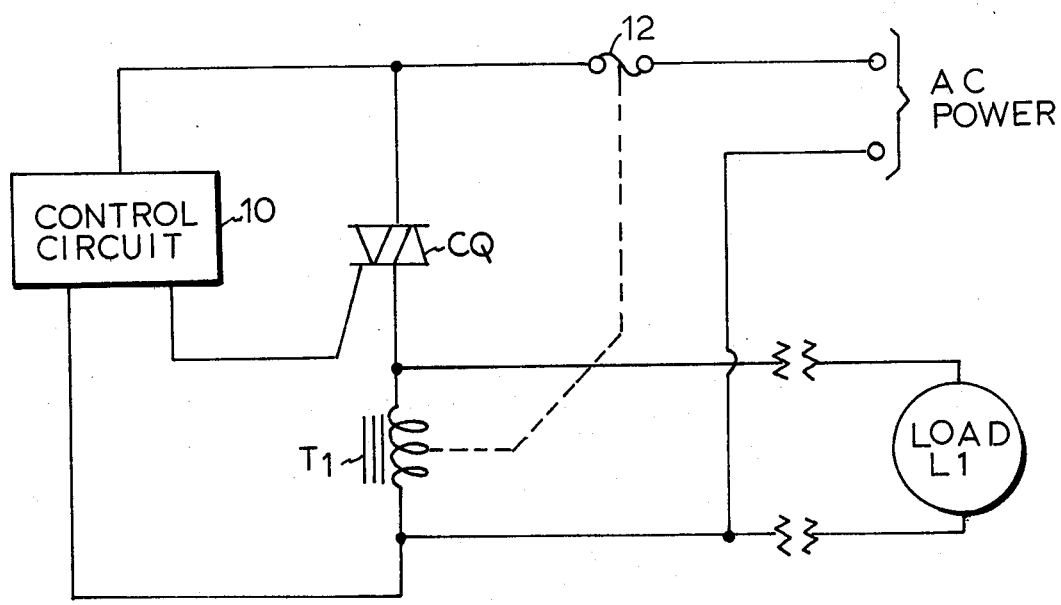

PASSIVE TRIAC OUTPUT ASYMMETRY DETECTOR

BACKGROUND OF THE INVENTION

This invention relates generally to a passive AC load protection circuit which is utilized with an AC powered load that is controlled by a semi-conductor or other control element, and specifically to a circuit that protects against damage to an AC inductive load resulting from asymmetrical input power. The protection circuit is located remotely from the load.

It is a well known practice to utilize on-off or proportional control elements with AC inductive loads such as motors and the like, as well as with various resistive loads. One of the limitations of the solid state control element is that when utilized with inductive loads such as motors, should the control element fail, often times this can result in a half wave power input to the load. Asymmetrical input power causes heating which could result in damage to the load or create a fire hazard. The present invention allows for the safe use of a solid state control element or the like by providing a protection circuit that is employed in conjunction with such a control preventing load damage in spite of control element failure which may result in asymmetrical input power to the load.

BRIEF DESCRIPTION OF THE INVENTION

A circuit for protecting an AC driven inductive load which is controlled by a solid state element such as a triac or the like, comprised of an inductive circuit element having a high AC inductance and a low DC resistance and a thermal link that electrically opens at a predetermined temperature, the link being placed in series with the AC power input to the control or to the load. The inductive circuit element is placed in parallel with the load and is in thermal communication with the thermal link. If the control element should fail, causing asymmetrical input power to be received by the load (and therefore the protective inductive circuit element), because the protective element has a low DC resistance, asymmetrical input power wave forms will cause a high DC current draw in the protective element, causing it to rapidly heat. This rapid heating will thus, at a predetermined temperature, cause the thermal link to open, effecting a shutdown of the load, preventing damage to the load.

It is an object of this invention to provide a safety circuit for protecting an AC load that is non-complex in construction, that has extremely high reliability, and that may be easily installed in present circuitry.

It is another object of this invention to provide a protective circuit that causes input power to a load to be removed, the load being controlled by a semiconductor element or the like such as a triac.

In accordance with these and other objects which will be apparent hereinafter, the instant invention will now be described with particular reference to the accompanying drawings.

BRIEF DESCRIPTION OF THE DRAWINGS

The drawing shows a schematic diagram of the instant invention.

PREFERRED EMBODIMENT OF THE INVENTION

Referring now to the drawing, the instant invention is shown comprised of an inductive circuit element, T1, which is connected in parallel to load L1. As shown, the load L1 is controlled by a triac CQ connected to a conventional control circuit 10. A thermal link 12 is positioned in series with the load L1 and triac CQ such that if the link opens by thermal heating at a predetermined temperature, AC input power to the control CQ and control circuit 10 and therefore the load L1, will be effectively removed, protecting the load L1 from damage.

The inductor T1 which is connected in parallel to load L1 has a high AC inductance and a very low DC resistance. If the control CQ or control circuit 10 fails, which could result in asymmetrical AC input power (pulsating DC) being received by the load L1, the inductor T1 will draw heavy current causing it to self-heat. The thermal link, which may be located in the windings of the inductor, will heat to its predetermined temperature and open electrically to remove the AC input power from the control and the load. The inductor T1 is physically positioned remotely from the load L1.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. A passive device for protecting an AC load which is being controlled by a semiconductor element such as a triac or the like from a failure of the triac resulting in asymmetrical input wave power to the load, comprising:
    an inductive means for generating a predetermined amount of thermal energy in response to a particular asymmetrical input wave connected in parallel with said load;
    a thermal circuit breaking means that heats more rapidly than said load disposed in thermal contact with said inductive means, said thermal circuit breaking means having a predetermined temperature threshold value upon which it opens, corallated in conjunction with the thermal energy generated by said inductive means, said thermal circuit breaking means being connected in series between the AC input power and the load whereby when the thermally actuated circuit breaking means is open, power to the load will be removed.

2. A passive device as in claim 1, wherein:
    said inductive means and said thermal circuit breaking means are located remotely from said load.

* * * * *